United States Patent
Ojha et al.

(10) Patent No.: US 10,643,860 B2
(45) Date of Patent: May 5, 2020

(54) METHODS OF THINNING AND STRUCTURING SEMICONDUCTOR WAFERS BY ELECTRICAL DISCHARGE MACHINING

(71) Applicant: Infineon Technologies AG, Neubiberg (DE)

(72) Inventors: Nirdesh Ojha, Villach (AT); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 15/935,867

(22) Filed: Mar. 26, 2018

(65) Prior Publication Data
US 2019/0295855 A1 Sep. 26, 2019

(51) Int. Cl.
| | |
|---|---|
| *H01L 21/326* | (2006.01) |
| *H01L 21/304* | (2006.01) |
| *H01L 21/288* | (2006.01) |
| *B23H 7/26* | (2006.01) |

(52) U.S. Cl.
CPC ............ *H01L 21/326* (2013.01); *B23H 7/26* (2013.01); *H01L 21/2885* (2013.01); *H01L 21/304* (2013.01)

(58) Field of Classification Search
None
See application file for complete search history.

(56) References Cited

U.S. PATENT DOCUMENTS

| | | | | | |
|---|---|---|---|---|---|
| 3,914,170 | A | * | 10/1975 | Ballard | .................... B23H 3/02 204/224 M |
| 4,131,524 | A | * | 12/1978 | Gieles | ................. H01L 21/3063 205/656 |
| 5,429,984 | A | * | 7/1995 | Masaki | .................... B23H 1/00 219/69.17 |

(Continued)

FOREIGN PATENT DOCUMENTS

DE  102014104630 A1  10/2014

OTHER PUBLICATIONS

"Pilot line for low-cost SiC wafer to launch in 2016", Semiconportal, Aug. 22, 2014, Accessed online at https://www.semiconportal.com/en/archive/news/news-by-sin/140822-sicoxs-sic-wafer.html on Aug. 3, 2018.

(Continued)

*Primary Examiner* — Angel Roman
(74) *Attorney, Agent, or Firm* — Murphy, Bilak & Homiller, PLLC

(57) ABSTRACT

A method of structuring and/or thinning a semiconductor wafer having a plurality of functional chip sites includes forming one or more semiconductor devices in a device region of each functional chip site at a frontside of the semiconductor wafer, and forming an electrode at one of the frontside or a backside of the semiconductor wafer. The side of the semiconductor wafer at which the electrode is formed is structured by applying voltage pulses between the electrode and a tool electrode positioned above the semiconductor wafer as part of an electrical discharge machining (EDM)

(Continued)

process before the electrode is removed by the EDM process, and between the tool electrode and an intrinsic conductive layer formed on the side of the semiconductor wafer being structured after the electrode is removed by the EDM process.

27 Claims, 16 Drawing Sheets

(56) References Cited

U.S. PATENT DOCUMENTS

| | | | |
|---|---|---|---|
| 6,180,435 | B1 | 1/2001 | Ise et al. |
| 9,219,049 | B2 | 12/2015 | Berger et al. |
| 9,576,844 | B2 | 2/2017 | Berger et al. |
| 9,704,750 | B2 | 7/2017 | Rupp et al. |
| 9,793,167 | B2 | 10/2017 | Rupp et al. |
| 10,020,226 | B2 | 7/2018 | Rupp et al. |
| 2004/0058478 | A1 | 3/2004 | Islam et al. |
| 2005/0186711 | A1 | 8/2005 | Yee et al. |
| 2005/0263864 | A1 | 12/2005 | Islam et al. |
| 2006/0001130 | A1 | 1/2006 | Islam et al. |
| 2009/0275152 | A1 | 11/2009 | Rommeveaux et al. |
| 2014/0020951 | A1* | 1/2014 | Shah .................. A61N 1/3754 174/667 |
| 2014/0264374 | A1 | 9/2014 | Hecht et al. |
| 2015/0115458 | A1 | 4/2015 | Palm |
| 2015/0206802 | A1* | 7/2015 | Roesner ................ H01L 21/78 257/734 |
| 2015/0279941 | A1 | 10/2015 | Berger et al. |
| 2016/0225856 | A1 | 8/2016 | Berger et al. |
| 2016/0260699 | A1 | 9/2016 | Lehnert et al. |
| 2017/0018614 | A1 | 1/2017 | Rupp et al. |
| 2017/0278930 | A1 | 9/2017 | Ruhl et al. |
| 2018/0021919 | A1 | 1/2018 | Lehner |
| 2018/0047619 | A1 | 2/2018 | Lehnert et al. |
| 2018/0158916 | A1 | 6/2018 | Schulze et al. |
| 2018/0229320 | A1* | 8/2018 | Miyake .................. B23H 7/02 |

OTHER PUBLICATIONS

Campana, et al., "Micro-EDM and ECM in DI water", Proceedings of Annual Meeting of American Society of Precision Engineering (ASPE), 1999, pp. 1-4.

Gatzen, et al., "Electroplated Cu Micro Electrode for Application in Micro Electrostatic Discharge Machining (EDM)", 214th Electrochemical Society Meeting, 2008, p. 1.

Kibria, et al., "Experimentation and Analysis into Micro-Hole Machining in EDM on Ti—6Al—4V Alloy Using Boron Carbide Powder Mixed De-Ionized Water", International Journal of Materials, Manufacturing and Design, 2012, vol. 1, No. 1, Academic Research Journals, pp. 17-35.

Ojha, Nirdesh, "Electrical Discharge Machining of Non-Conductive Advanced Ceramics", PhD Thesis, Albert-Ludwigs-Universität Freiburg, Oct. 29, 2015.

Ojha, Nirdesh, et al., "Major parameters affecting the electric discharge machining of non-conductive SiC", Proceedings of the 10th International Conference on Multi-Material Micro Manufacture, 2013.

Ojha, Nirdesh, et al., "The Effect of the EDM Process on the Material Properties of Non-conductive Ceramics", Journal of Micro and Nano-Manufacturing 4 (1), 2016.

Zeller, Florian, et al., "Electrical Discharge Milling of Silicon Carbide with different Electrical Conductivity", Key Engineering Materials, vols. 611-612, 2014, pp. 677-684.

Zeller, Florian, et al., "Influence of Pulse Width on Micro Electrical Discharge Machining of Non-Conductive Silicon Carbide", Proceedings of the 4M/ICOMM2015 Conference, 2015.

Zhao, Yonghua, et al., "EDM mechanism of single crystal SiC with respect to thermal, mechanical and chemical aspects", Journal of Materials Processing Technology 236, 2016, pp. 138-147.

Zhao, Y. et al., "Experimental investigations into EDM behaviors of single crystal silicon carbide", The Seventeenth CIRP Conference on Electro Physical and Chemical Machining (ISEM), Procedia CIRP 6, 2013, pp. 135-139.

Zhao, Yonghua, et al., "Study of EDM cutting of single crystal silicon carbide", Precision Engineering 38, 2014, pp. 92-99.

* cited by examiner

METHODS OF THINNING AND STRUCTURING SEMICONDUCTOR WAFERS BY ELECTRICAL DISCHARGE MACHINING

BACKGROUND

SiC is increasingly being used as the semiconductor material for power semiconductor devices due to its material properties. Compared to Si, SiC-based power semiconductor devices provide higher efficiency, withstand higher breakdown voltage, operate at higher speed and require smaller package housings. However, compared to Si, SiC processing is more cost intensive. One reason for higher processing cost is that SiC has extremely high hardness compared to Si, which makes structuring and thinning SiC wafers using standard processes developed for Si wafers more cost intensive and time consuming.

Hence, new methods of thinning and structuring semiconductor wafers which are independent or at least less affected by material hardness are needed.

SUMMARY

According to an embodiment of a method of thinning a semiconductor wafer having a plurality of functional chip sites, the method comprises: forming one or more semiconductor devices in a device region of each functional chip site at a frontside of the semiconductor wafer; forming an electrode at a backside of the semiconductor wafer opposite the frontside, the electrode having a greater electrical conductivity than the backside of the semiconductor wafer; and thinning the semiconductor wafer by applying voltage pulses between the electrode at the backside of the semiconductor wafer and a tool electrode positioned over the backside as part of an electrical discharge machining (EDM) process before the electrode is removed by the EDM process, and between the tool electrode and an intrinsic conductive layer formed on the backside of the semiconductor wafer after the electrode is removed by the EDM process.

According to an embodiment of a method of structuring a semiconductor wafer having a plurality of functional chip sites, the method comprises: forming one or more semiconductor devices in a device region of each functional chip site at a frontside of the semiconductor wafer; forming an electrode at the frontside or at a backside of the semiconductor wafer opposite the frontside; and structuring the side of the semiconductor wafer at which the electrode is formed by applying voltage pulses between the electrode and a tool electrode positioned above the semiconductor wafer as part of an electrical discharge machining (EDM) process before the electrode is removed by the EDM process, and between the tool electrode and an intrinsic conductive layer formed on the side of the semiconductor wafer being structured after the electrode is removed by the EDM process.

According to an embodiment of an electrical discharge machining (EDM) apparatus, the EDM apparatus comprises an electrode and a power source. The electrode has an inner channel surrounded by a solid periphery. The channel is open at opposing ends. The electrode is configured to receive a dielectric liquid at one end and dispense the dielectric liquid at the opposite end during an EDM process. The power source is electrically coupled to the electrode, and configured to apply voltage pulses to the electrode during the EDM process.

According to another embodiment of an electrical discharge machining (EDM) method, the method comprises: positioning a tool electrode over a front or back side of a doped semiconductor wafer; and thinning the doped semiconductor wafer by applying voltage pulses between the tool electrode and the doped semiconductor wafer as part of an EDM process, wherein the doped semiconductor wafer functions as a second electrode to enable the EDM process.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

DETAILED DESCRIPTION

The embodiments described herein provide methods of thinning and structuring semiconductor wafers with active devices, by electrical discharge machining. The frontside and/or backside of a semiconductor wafer may be structured and/or thinned by the electrical discharge machining techniques described herein.

Figure 1B:
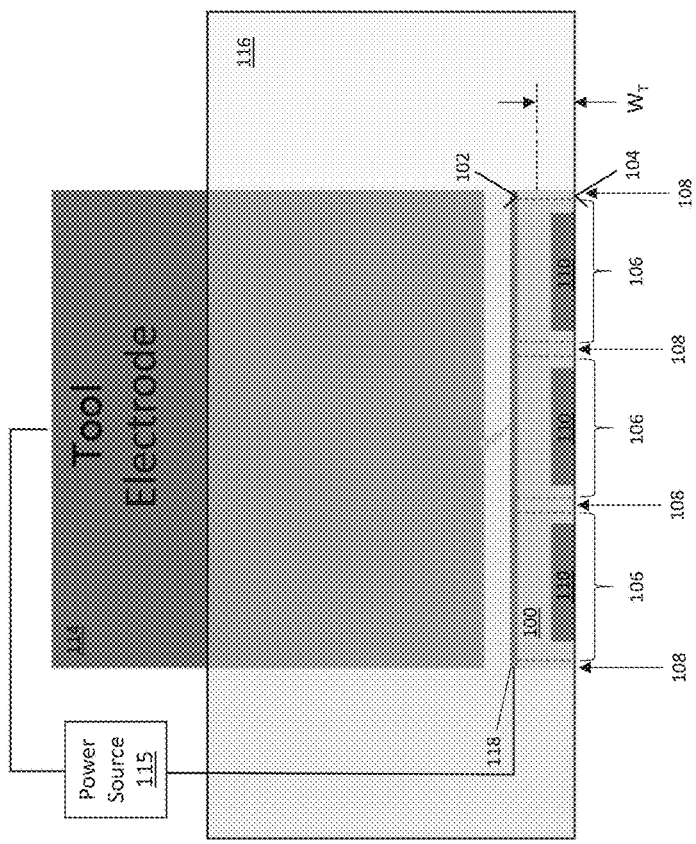
FIGS. 1A and 1B illustrate partial sectional views of an embodiment of thinning a backside of a semiconductor wafer having active devices formed at the frontside, by electrical discharge machining (EDM)
Figure 1A:
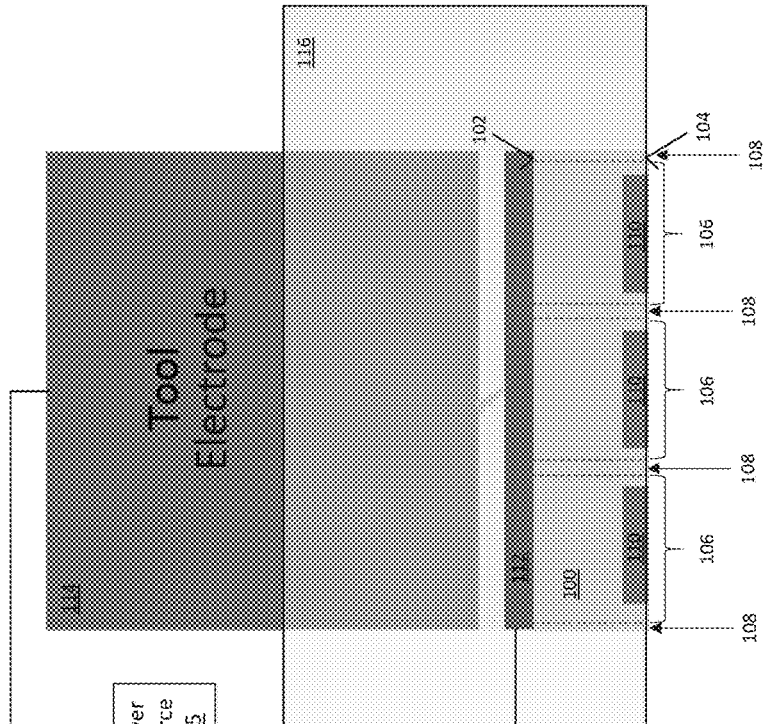

FIGS. 1A and 1B illustrate an embodiment of thinning the backside 102 of a semiconductor wafer 100 having active devices formed at the frontside 104, by electrical discharge machining (EDM). Any type of semiconductor wafer may be used. For example, the semiconductor wafer 100 may be a monocrystalline Si wafer. In other cases, the semiconductor wafer 100 may have a hardness less than Si, e.g. a Ge wafer, a GaAs wafer, etc. In other cases, the semiconductor wafer 100 may have a hardness greater than Si, e.g. a GaN wafer, a SiC wafer, etc. In a specific embodiment, the semiconductor wafer 100 is a monocrystalline 4H-SiC wafer. The semiconductor wafer 100 may be doped or undoped. In the case of a doped wafer, the conductivity of the semiconductor wafer 100 may be greater than 0.01 Siemens(S)/cm (or a resistivity of less than 100 Ωcm) in some embodiments.

In each case, the semiconductor wafer 100 has a plurality of functional chip sites 106 formed at the frontside 104 of the semiconductor wafer 100. Each functional chip site 106 is a separate or dedicated region of the semiconductor wafer 100 in which one or more passive and/or active devices are formed. The functional chip sites 106 may be separated from one another by dicing streets 108 the boundaries of which are graphically illustrated in FIGS. 1A and 1B as dashed lines, and indicate where the semiconductor wafer 100 is to be singulated, e.g. by mechanical sawing, laser cutting, etc., to separate the functional chip sites 106 into individual physical dies (chips). Each functional chip site 106 has one or more semiconductor devices formed in a device region 110 of the functional chip site 106 at the frontside 104 of the semiconductor wafer 100. Any type of semiconductor device may be formed at the frontside 104 of the semiconductor wafer 100, using standard device fabrication processes. For example, the semiconductor devices may be power devices such as power transistors and/or power diodes, logic devices such as memory devices, processors, ASICs (application-specific integrated-circuits), etc., sensors, passive devices such as capacitors, resistors and/or inductors, etc. The semiconductor devices may be vertical devices in that the current flow direction is between the front and back surfaces 104, 102 of the device. Alternatively or in addition, the semiconductor devices may be lateral devices in that the current flow direction is confined along the front surface 104 of the device. Frontside processing of the semiconductor wafer 100 may be performed before the backside thinning, which can include both device fabrication and frontside metallization.

FIG. 1A shows the semiconductor wafer 100 with an assisting electrode (AE) 112 formed at the backside 102 of the semiconductor wafer 100. The assisting electrode 112 has a greater electrical conductivity than the backside 102 of the semiconductor wafer 100, so that substantial current does not flow through the semiconductor wafer 100 to the frontside 104 during the EDM thinning process.

In one embodiment, the assisting electrode 112 is deposited on the backside 102 of the semiconductor wafer 100. For example, a metal layer or a carbon layer may be screen printed or deposited on the wafer backside 102. In a more specific embodiment, a carbon-based lacquer may be screen printed onto the wafer backside 102 and dried to form the assisting electrode 112. In another embodiment, the assisting electrode 112 is a highly doped region formed at the backside 102 of the semiconductor wafer 100.

A tool electrode 114 is positioned over he wafer backside 102. The backside 102 of the semiconductor wafer 100 is thinned by a power source 115 applying voltage pulses between the assisting electrode 112 formed at the wafer backside 102 and the tool electrode 114 positioned over the backside 102, as part of the EDM process. No direct physical contact occurs between the tool electrode 114 and the assisting electrode 112. Hence, the EDM process may be used to machine/remove semiconductor material much harder than the tool electrode 114, e.g. such as SiC. The EDM process machines/removes the semiconductor material by sublimation, melting, decomposition and/or spalling.

By applying the assisting electrode 112 to the backside 102 of the semiconductor wafer 100, a dielectric liquid 116 such as oil may be used to aid in thinning the wafer backside 102 regardless of its conductivity. The dielectric liquid 116 covers the backside 102 of the semiconductor wafer 100. In one embodiment, the dielectric liquid 116 may completely cover the backside 102 of the semiconductor wafer 100. During the EDM process, the tool electrode 114 and/or the semiconductor wafer 100 may be moved in the dielectric liquid 116 e.g. only in the vertical direction (z) so that the tool electrode 114 remains in close proximity to the wafer backside 102 to maintain a plasma between the tool electrode 114 and the assisting electrode 112 formed at the backside 102 of the semiconductor wafer 100 before the electrode 112 is removed by the EDM process, and between the tool electrode 114 and an intrinsic conductive layer (ICL) 118 formed at the wafer backside 102 after the assisting electrode 112 is removed by the EDM process. In addition or alternatively, the plasma may be maintained by increasing the applied voltage.

The initial discharge, which is graphically illustrated in FIG. 1A as a spark/bolt, may take place between the tool electrode 114 and the assisting electrode 112 formed at the backside 102 of the semiconductor wafer 100. The voltage and frequency of the pulses applied by the power source 115 between the two electrodes 112, 114 are sufficient to free metal ions from the assisting electrode 112 in a region of the assisting electrode 112 positioned in close proximity to the tool electrode 114. Eventually this region of the assisting electrode 112 is removed.

Plasma produced during sparking may crack the dielectric liquid 116, forming a pyrostatic carbon. Once the assisting electrode 112 has been removed, and the insulating backside 102 of the semiconductor wafer 100 is exposed, pyrostatic carbon may deposit on the exposed backside 102 of the semiconductor wafer 100. The deposited pyrostatic carbon may form the intrinsic conductive layer 118 on the backside 102 of the semiconductor wafer 100, as shown in FIG. 1B. The intrinsic conductive layer 118 provides the required electrical conductivity which allows for continued thinning of the wafer backside 102 with successive sparks (shown as a spark/bolt in FIG. 1B) caused by voltage pulses applied by the power source 115 between the tool electrode 114 and the intrinsic conductive layer 118 formed on the wafer backside 102 after the assisting electrode 112 is removed by the EDM process, and as material such as ions and/or chunks of semiconductor is being removed from the wafer backside 102 during the EDM process. In one embodiment, the pulse energy (Voltage*Current*Pulse-On-Time) per voltage pulse is at most 1 milli-joule during the EDM process.

Once the assisting electrode 112 is removed, and with every additional spark, a part of the wafer backside 102 is removed and pyrostatic carbon may be deposited thereon to maintain the intrinsic conductive layer 118. By using EDM with the assisting electrode 112, a semiconductor wafer with very high hardness such as for example a SiC or a GaN wafer, may be thinned regardless of its electrical conductivity. Furthermore, the intrinsic conductive layer 118 generated by the EDM process may be removed e.g. by an oven process and/or by use of an oxygen-rich plasma, or instead used as seed layer for a subsequent electroplating process in which metal is deposited on the thinned backside 102 of the semiconductor wafer 100. In addition or as an alternative, the intrinsic conductive layer 118 may be removed and an additional metal layer may be deposited on the backside 102, wherein the additional metal layer may be used as a seed layer for a subsequent electroplating process. If the EDM process is conducted at the frontside 104, the electroplating is applied, mutatis mutandis, at the frontside 104. The EDM process continues until the target wafer thickness (e.g. 40 to 100 μm or less, e.g. 10 to 20 μm) is achieved.

The open source voltage applied across the electrodes 112, 114 can range from 14 V to 200 V, for example. The current of the pulses applied by the power source 115 to the electrodes 112, 114 can range from 0.1 to 100 Amperes, for example. The duration of the pulses may be varied as desired, as may be the off time between pulses. The EDM process may be stopped one or more times during the thinning process, for example for several seconds at a time, to allow replacement of dirty dielectric liquid with new dielectric liquid. The EDM tool can automatically trim the tool electrode during the EDM process, to maintain tool electrode integrity. When a pulse starts to take place, the diameter of the resulting plasma region formed between the tool electrode 114 and the semiconductor wafer 100 depends on the pulse on time. The duration of the pulses may be selected to control the degree or localization of the plasma created by the EDM process. For a large pulse duration, the plasma may be bigger. In the microsecond EDM range, the plasma diameter is smaller and hence the amount of joule heating may be relatively small and a small localized region of the semiconductor wafer 100 is affected.

In one embodiment, the voltage pulses are applied by the power source 115 for periods of at most 12 microseconds as part of the EDM process, e.g. as the final target thickness ($W_T$) for the semiconductor wafer 100 is approached. This embodiment is also referred to herein as μ-EDM, owing to the micro-second pulse duration. As used herein, 'EDM' is a term intended to broadly mean electrical discharge machining and includes the case where the pulse energy (Voltage*Current*Pulse-On-Time) per pulse is at most 1 mili joules (μ-EDM) and the case where the energy per pulse is greater than 1 mili joules. The material removal process is slower with a μ-EDM process which has energy per pulse less than 1 mili joules, as compared to an EDM process having energy per pulse greater than 1 mili joules. However, the μ-EDM process may yield a smoother (less rough) surface with less thickness variation and less likelihood of wafer cracking.

In one embodiment, the voltage pulses are applied by the power source 115 with pulse energy per pulse greater than 1 mili joules during a first part of the EDM process and with pulse energy per pulse less than 1 mili joules during a second part of the EDM process after the first part. According to this embodiment, most of the wafer thinning is achieved during the first part of the EDM process, with the second part of the μ-EDM process yielding a relatively smooth final backside surface with less thickness variation.

In one embodiment, the backside 102 of the semiconductor wafer 100 may be thinned initially by grinding the backside 102 with a grinding wheel before beginning the EDM process. According to this embodiment, the wafer backside 102 is partly thinned by the grinding process and partly thinned by the EDM process.

Figure 2:
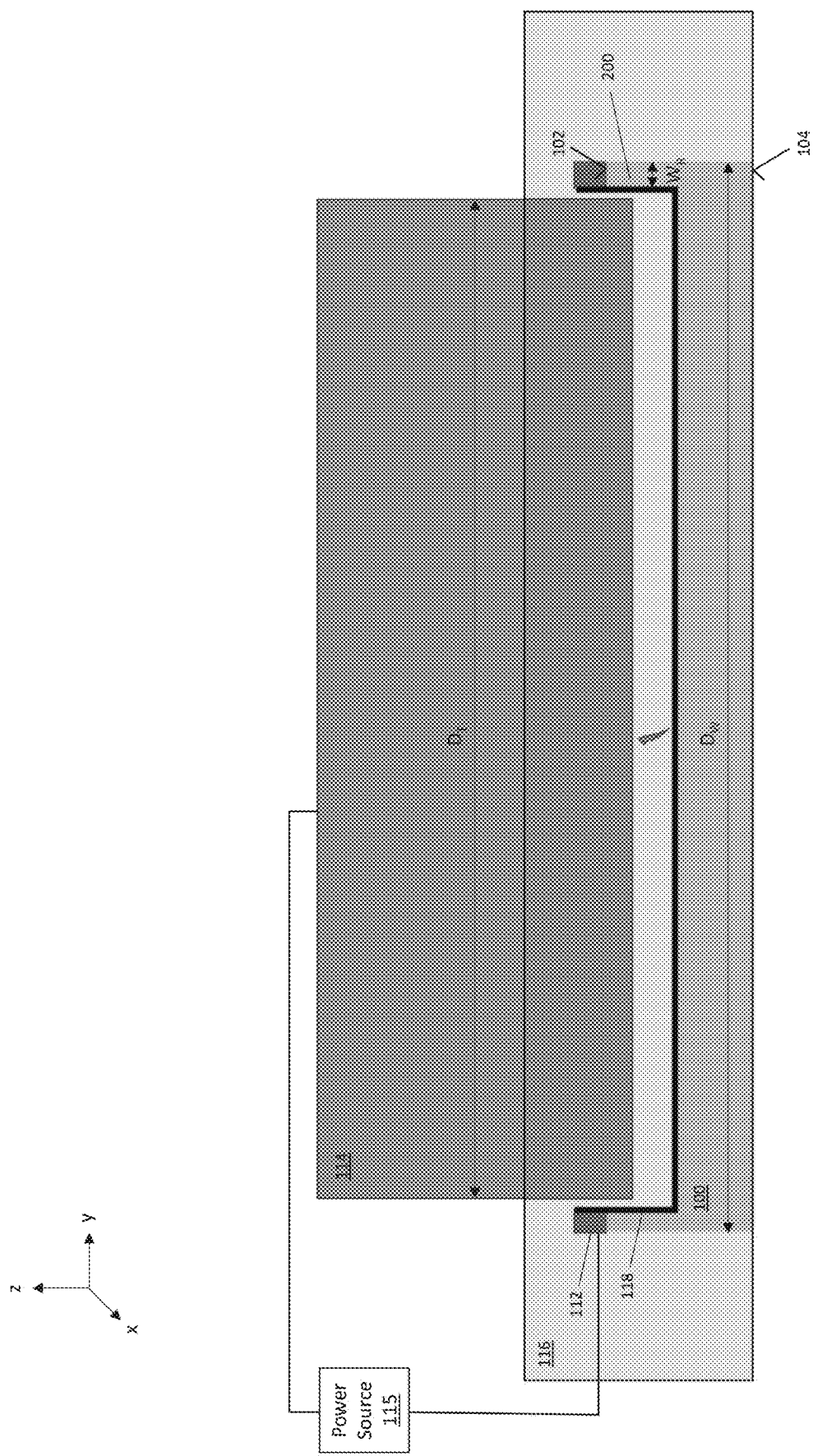
FIG. 2 illustrates a partial sectional view of another embodiment of thinning a backside of a semiconductor wafer having active devices formed at the frontside, by EDM.

FIG. 2 illustrates a further embodiment of thinning the backside 102 of a semiconductor wafer 100 having active devices formed at the frontside 104, by electrical discharge machining (EDM). The embodiment shown in FIG. 2 is similar to the embodiment shown in FIGS. 1A and 1B. Different, however, the tool electrode 114 has a diameter ($D_T$) slightly less than the wafer diameter ($D_W$). This way, an annular ring 200 of semiconductor material remains around the periphery of the semiconductor wafer 100 after the EDM process is terminated. The functional chip sites 106, dicing streets 108 and active device regions 110 at the frontside 104 of the semiconductor wafer 100 are not shown in FIG. 2 for ease of illustration.

For semiconductor wafers having a relatively small thickness post thinning (e.g. 40 to 100 μm or less, e.g. 10 to 20 μm), such as in the case of vertical power semiconductor devices such as power diodes, power MOSFETs (metal oxide semiconductor field effect transistors), IGBTs (insulated gate bipolar transistors), HEMTs (high electron mobility transistors), etc., the integral, annular ring 200 of semiconductor material formed around the periphery of the semiconductor wafer 100 may provide mechanical stability/support for the thinned wafer 100 during subsequent handling and processing. The width ($W_R$) of the integrally-formed annular ring 200 of semiconductor material can range from 0.5 to 5 mm, for example.

FIGS. 3A through 3E illustrate an embodiment of milling the backside 102 of a semiconductor wafer 100 having active devices formed at the frontside 104, by electrical discharge machining (EDM). The functional chip sites 106, dicing streets 108 and active device regions 110 at the frontside 104 of the semiconductor wafer 100 are not shown in FIGS. 3A through 3E for ease of illustration.

According to the embodiment illustrated in FIGS. 3A through 3E, the tool electrode 114 has a diameter ($D_T$) significantly less than the diameter ($D_W$) of the semiconductor wafer 100. The EDM process includes covering the backside 102 of the semiconductor wafer 100 with a dielectric liquid 116 such as oil, and moving the tool electrode 114 and/or the semiconductor wafer 100 in the dielectric liquid 116 so that the tool electrode 114 may be repositioned in both the horizontal direction (y) along the wafer backside 102 and in the vertical direction (z) towards the wafer backside 102. The tool electrode 114 is close enough, but does not contact the assisting electrode 112 (before removal) or the intrinsic conductive layer 118 formed at the wafer backside 102 after the assisting electrode 112 is removed by the EDM process, so that a plasma occurs between the tool electrode 114 and the assisting electrode 112 (before removal) or between the tool electrode 114 and the intrinsic conductive layer 118 after the assisting electrode 112 is removed. In addition or alternatively, the plasma may be maintained by increasing the applied voltage.

In one embodiment, the EDM process starts with machining a hole on a part of the semiconductor wafer 100, caused by the vertical movement (z) of the tool electrode 114. The tool electrode 114, which may be rotating, is then moved in the horizontal direction (y) to remove by milling a layer of the workpiece (a layer of the assisting electrode 112, if still present, or a layer of the wafer backside 102). Once the complete layer has been removed, the tool electrode 114 is moved once again vertically downward. With this approach, the semiconductor wafer 100 may be milled using EDM or μEDM. Also, only the portion to be removed by milling is affected by the EDM process. As such, a heat-affected region is absent from the bulk of the semiconductor wafer 100.

Figures 3A, 3B, 3C:
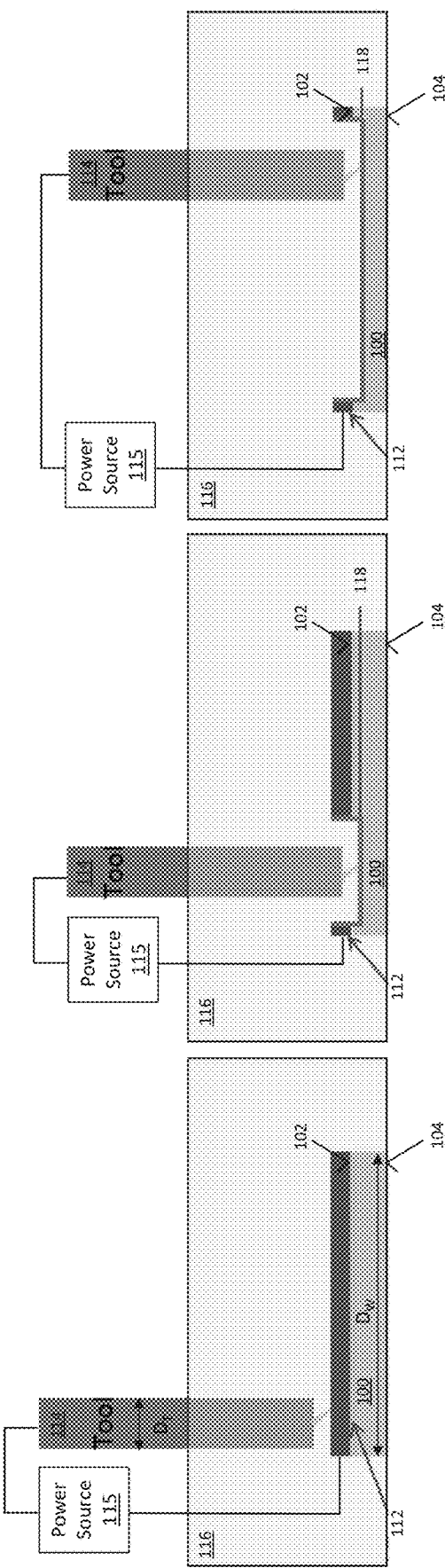
FIGS. 3A through 3E illustrate partial sectional views of yet another embodiment of thinning a backside of a semiconductor wafer having active devices formed at the frontside, by EDM.
Figures 3D, 3E:
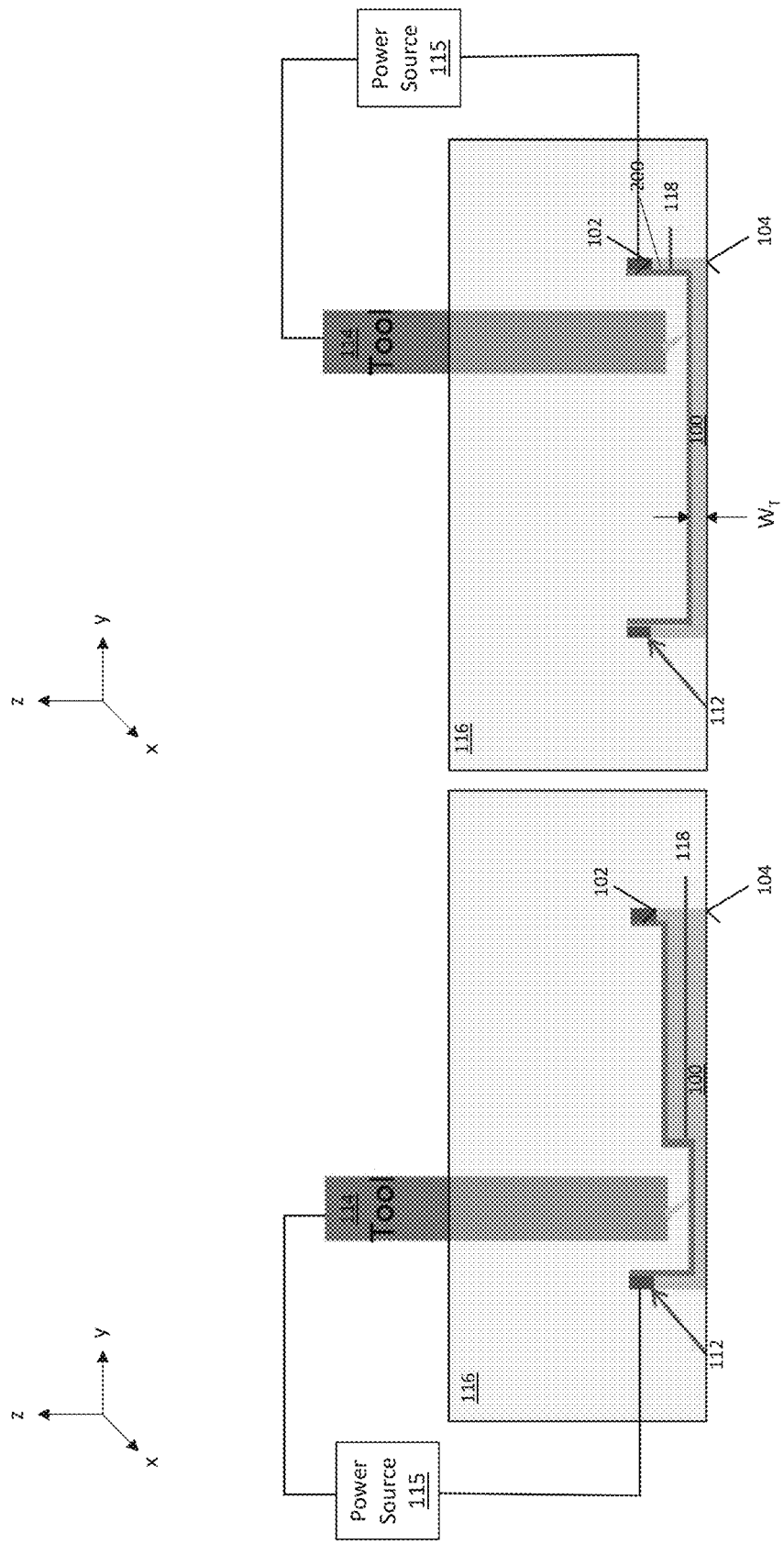

As explained above, the initial discharge, which is graphically illustrated in FIG. 3A as a spark/bolt, takes place between the tool electrode 114 and the assisting electrode 112 formed at the backside 102 of the semiconductor wafer 100. The voltage and frequency of the pulses applied by the power source 115 between the two electrodes 112, 114 are sufficient to free metal ions from the assisting electrode 112 in a region of the assisting electrode 112 positioned in close proximity to the tool electrode 114. Eventually this region of the assisting electrode 112 is removed. Plasma produced during sparking cracks the dielectric liquid 116, forming a pyrostatic carbon. Once the assisting electrode 1121 has been removed, and the insulating backside 102 of the semiconductor wafer 100 is exposed, the pyrostatic carbon deposits on the exposed backside 102 of the semiconductor wafer 100. The deposited pyrostatic carbon forms the intrinsic conductive layer 118 on the wafer backside 102, as shown in FIGS. 3B through 3E.

The intrinsic conductive layer 118 provides the required electrical conductivity which allows for continued thinning of the wafer backside 102 with successive sparks (shown as a spark/bolt in FIGS. 3B through 3E) caused by voltage pulses applied by the power source 115 between the tool electrode 112 and the intrinsic conductive layer 118 formed on the backside 102 of the semiconductor wafer 100, after the assisting electrode 112 is removed by the EDM process, and as material such as ions and/or chunks of semiconductor is being removed from the wafer backside 102 during the EDM process. More than one complete horizontal scan of the tool electrode 114 at different vertical positions may be needed as shown in FIGS. 3B through 3E, to achieve the final wafer target thickness ($W_T$).

The movement of the tool electrode 114 may be limited in the horizontal direction (y) to less than the diameter ($D_W$) of the semiconductor wafer 100, so that an annular ring 200 of semiconductor material remains around the periphery of the semiconductor wafer 100 after the EDM process is terminated.

Compared to the embodiment shown in FIGS. 1A and 1B, the embodiment shown in FIGS. 3A through 3E allows for reduced surface roughness and easier maintenance of the tool electrode 114.

Figure 4:
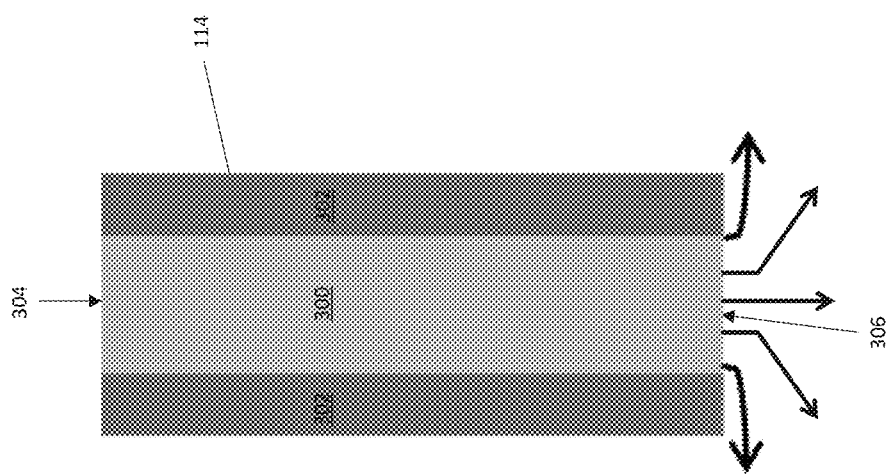
FIG. 4 illustrates a partial sectional view of an embodiment of an EDM tool electrode.

FIG. 4 illustrates a cross-sectional view of the tool electrode 114 used during any of the EDM methods described herein. According to this embodiment, the tool electrode 114 has an inner channel 300 surrounded by a solid periphery 302. The channel 300 is open at opposing ends 304, 306. This way, the tool electrode 114 can receive a dielectric liquid 116 at the end 304 facing away from the semiconductor wafer 100 being processed, and dispense the dielectric liquid 116 at the opposite end 306 of the tool electrode 114 and over the backside 102 of the semiconductor wafer 100 as part of the EDM process. Compared to a solid rod type electrode, the tool electrode 114 with the open channel 300 shown in FIG. 4 aids in bringing fresh dielectric to the machining region which helps in reducing/avoiding short circuits and abnormal pulses. Also, the tool electrode 114 with the open channel 300 shown in FIG. 4 improves the removal efficiency of spalled particles from the semiconductor wafer 100 being processed.

In each of the EDM embodiments described herein, the tool electrode 114 and/or the semiconductor wafer 100 being processed may be rotated as part of the EDM process. For example, by rotating the semiconductor wafer 100 in the same direction of rotation as the tool electrode 114 while performing the EDM process shown in FIGS. 3A through 3E, more efficient removal of spalled particles results. After thinning of the wafer backside 102 is complete, the semiconductor wafer 100 may be further processed. Further processing may include at least one of: forming electrical contacts on the backside 102 of the semiconductor wafer 100, functional test of the functional chip sites 106, singulation of the semiconductor wafer 100 to separate the functional chip sites 106 into individual physical dies, etc. Any standard wafer singulation technique such as mechanical sawing, laser cutting, etc., may be used to yield the individual dies.

Figure 5:
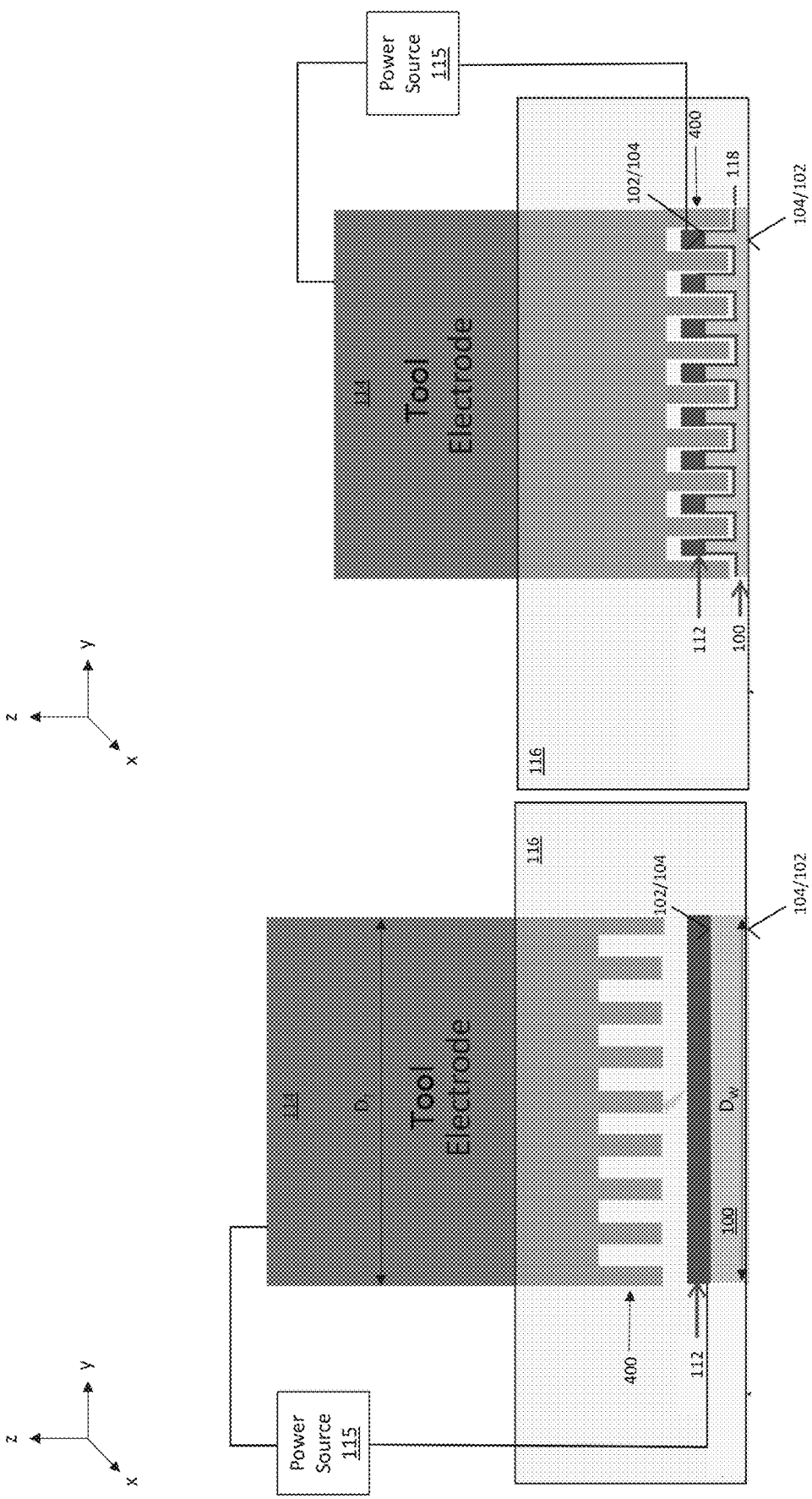
FIGS. 5A and 5B illustrate partial sectional views of an embodiment of structuring a semiconductor wafer having a plurality of functional chip sites using a pre-structured tool electrode, by EDM, FIG. 6 illustrate a partial sectional view of another embodiment of structuring a semiconductor wafer having a plurality of functional chip sites, by EDM.

FIGS. 5A and 5B illustrate an embodiment of structuring the backside 102 or the frontside 104 of a semiconductor wafer 100 having a plurality of functional chip sites 106, by electrical discharge machining (EDM). The functional chip sites 106, dicing streets 108 and active device regions 110 at the frontside 104 of the semiconductor wafer 100 are not shown in FIGS. 5A and 5B for ease of illustration, and to demonstrate that the backside 102 and the frontside 104 of the semiconductor wafer 100 may be structured according to this embodiment.

In FIG. 5A, an assisting electrode 112 is formed at the backside 102 and/or frontside 104 of the semiconductor wafer 100. In general, the assisting electrode 112 may be formed at the wafer frontside 104 or backside 102 in accordance with any of the embodiments previously described herein. The EDM tool electrode 114 may be structured with a pattern 400 to be imparted on the semiconductor wafer 100, and is positioned above and spaced apart from the assisting electrode 112. The tool electrode 114 has a diameter ($D_T$) approximately equal to the diameter ($D_W$) of the semiconductor wafer 100 according to this embodiment.

In FIG. 5B, the side 102/104 of the semiconductor wafer 100 with the assisting electrode 112 is structured by the power source 115 applying voltage pulses between the assisting electrode 112 and the tool electrode 114 if the assisting electrode 112 is still present, and between the tool electrode 114 and an intrinsic conductive layer 118 formed on the side 102/104 of the semiconductor wafer 100 being structured after the assisting electrode 112 is removed in this region during the EDM process. The side 102/104 of the semiconductor wafer 100 with the assisting electrode 112 may be covered with a dielectric liquid 116 such as oil, as previously described herein. The tool electrode 114 and/or the semiconductor wafer 100 is moved in the dielectric liquid 116 e.g. only in the vertical direction (z) so that the tool electrode 114 remains in close proximity to the semiconductor wafer 100, to maintain a plasma between the patterned end 400 of the tool electrode 114 and the assisting electrode 112 if still present, and between the patterned end 400 of the tool electrode 114 and the intrinsic conductive layer 118 in regions where the assisting electrode 112 has been removed, as previously described herein in connection with FIGS. 1A and 1B. The pattern 400 structured into the tool electrode 114 is transferred to the semiconductor wafer 100 using this embodiment. Either the EDM or μEDM processes previously described herein may be used to structure the wafer frontside 104 or backside 102. In addition or alternatively, the plasma may be maintained by increasing the applied voltage.

Figure 6:
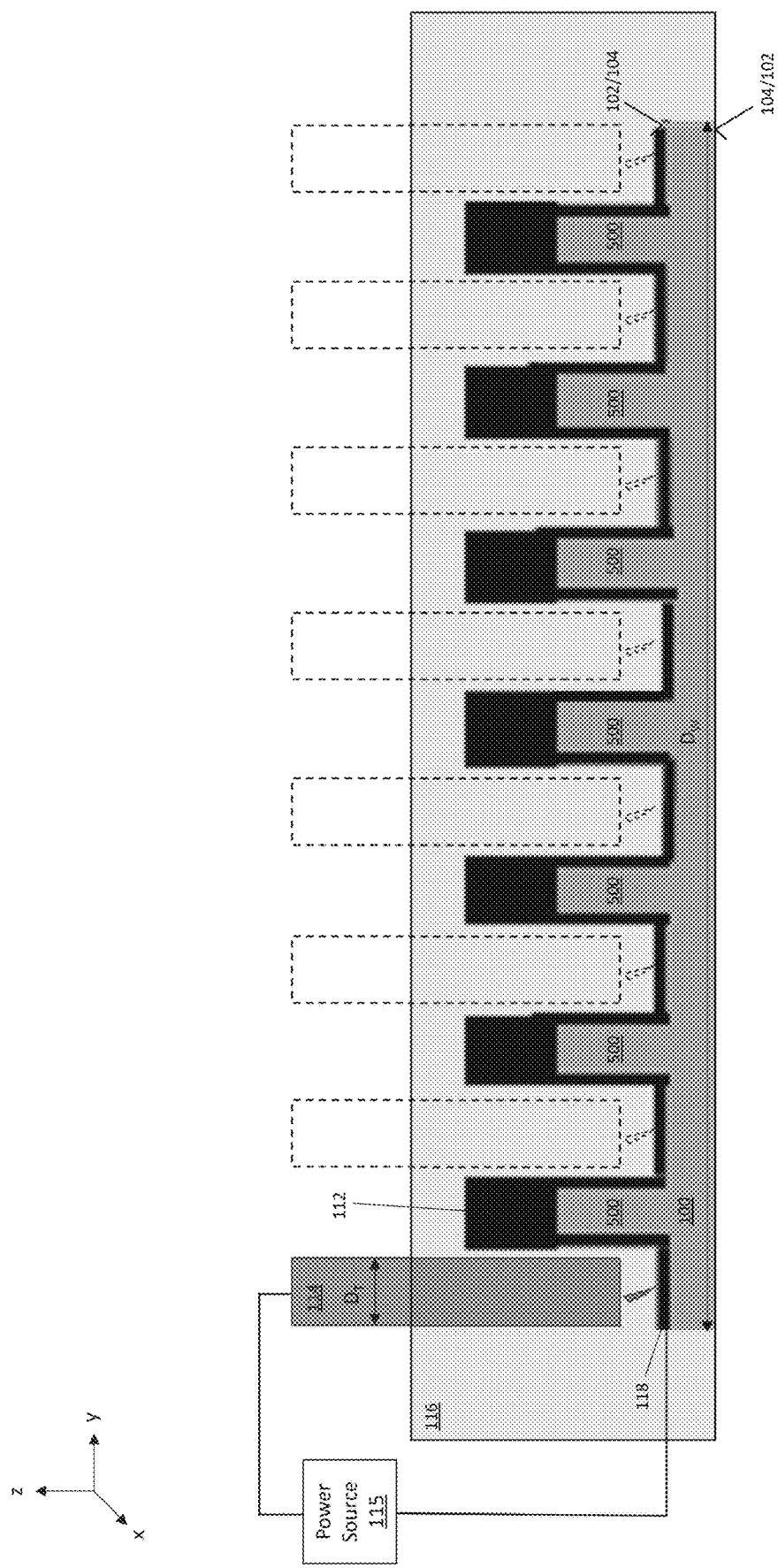

FIG. 6 illustrates another embodiment of structuring the backside 102 or the frontside 104 of a semiconductor wafer 100 having a plurality of functional chip sites 106, by milling electrical discharge machining (EDM). The functional chip sites 106, dicing streets 108 and active device regions 110 at the frontside 104 of the semiconductor wafer 100 are not shown in FIG. 6 for ease of illustration, and to demonstrate that either the frontside 104 or the backside 102 of the semiconductor wafer 100 may be structured according to this embodiment.

In FIG. 6, the EDM tool electrode 114 has a diameter ($D_T$) less than the diameter ($D_W$) of the semiconductor wafer 100. According to this embodiment, the EDM process includes covering the side 102/104 of the semiconductor wafer at which the assisting electrode 112 is formed with a dielectric liquid 116 such as oil. The tool electrode 114 and/or the semiconductor wafer 100 is moved in the dielectric liquid 116 so that the tool electrode 114 can be repositioned in the horizontal direction (y) along the side 102/104 of the semiconductor wafer being structured, and in the vertical direction (z) towards the semiconductor wafer 100 to maintain a plasma between the tool electrode 114 and the assisting electrode 112 if still present, and between the tool electrode 114 and the intrinsic conductive layer 118 in regions where the assisting electrode 112 has been removed, as previously described herein in connection with FIGS. 3A through 3E and so as to structure a pattern in the semiconductor wafer 100 instead of thinning the wafer 100. In addition or alternatively, the plasma may be maintained by increasing the applied voltage.

In general, the vertical and horizontal movement of the tool electrode 114 may be controlled, for example to form structures 500 in the semiconductor wafer 100. Such structures 500 may have dimensions down to approximately 50 µm×50 µm. Freestanding structures 500 can have a 20 µm minimum dimension. High aspect ratio structures 500 also may be formed, depending on the dimensions of the tool electrode 114 and parameters (V, I, pulse on-time, etc.) of the EDM process used to form the structures 500.

In some cases, the semiconductor wafer 100 is relatively thin e.g. 40 to 100 µm or less, e.g. 10 to 20 µm. In these cases, the backside 102 of the semiconductor wafer 100 may be structured as described above in connection with FIGS. 5A and 5B or FIG. 6. With such a structured backside 102, an additional annular ring around the periphery of the thin wafer for mechanical support/stability may be omitted. Instead, the structured backside 102 provides adequate mechanical support. The backside structures formed by the EDM processes described herein may also provide increased adherence to a metal layer formed on the wafer backside 102, by providing more surface area for contacting the metal layer.

Figure 7:
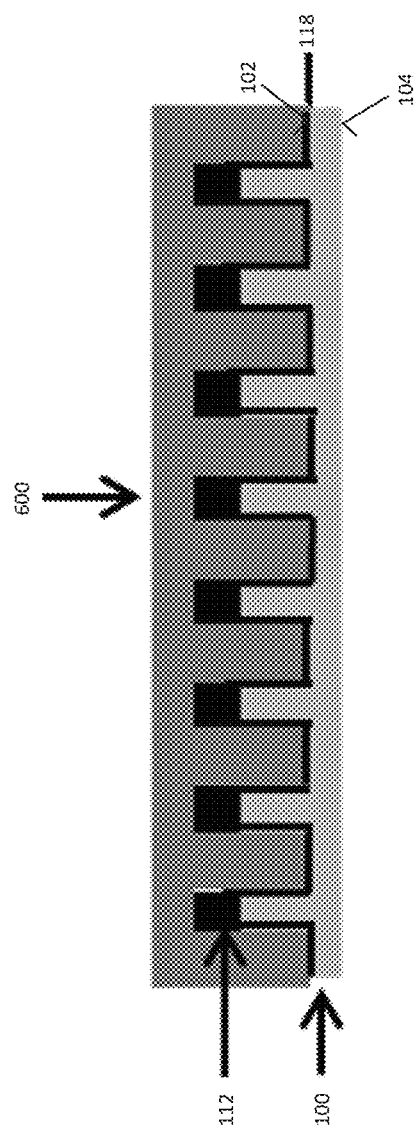
FIG. 7 illustrate a partial sectional view of an embodiment of a semiconductor wafer structured by EDM and having a metal layer formed on the structured surface.

FIG. 7 illustrates an embodiment in which the intrinsic conductive layer 118 formed on the structured wafer backside 102 during EDM processing is used as a seed layer for electroplating a metal layer 600 on the structured backside 102 of the semiconductor wafer 100. The adherence of the metal layer 600 to the semiconductor wafer 100 is enhanced due to the greater surface area contact provided between the metal layer 600 and the structured backside 102 of the semiconductor wafer 100. Also, lower contact resistance is realized as is better heat transfer. The functional chip sites 106, dicing streets 108 and active device regions 110 at the frontside 104 of the semiconductor wafer 100 are not shown in FIG. 7 for ease of illustration.

Figure 8A:
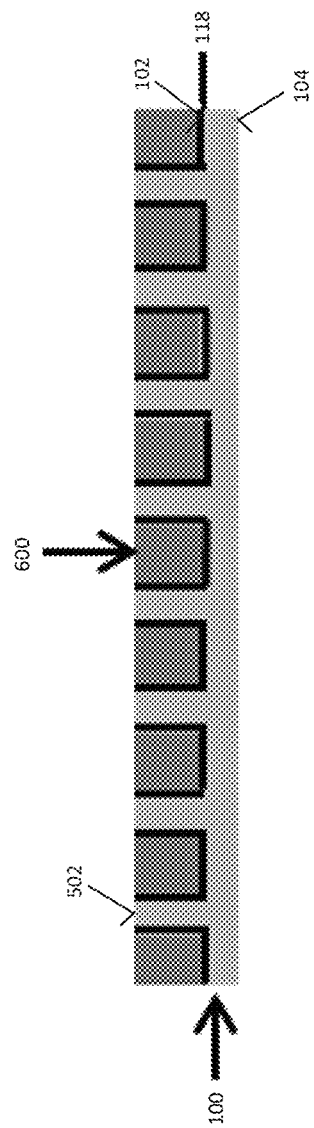
FIG. 8A illustrate a partial sectional view of an embodiment of a semiconductor wafer structured by EDM, having a metal layer formed on the structured surface and after structuring of layers including the metal layer (for example by grinding).

FIG. 8A illustrates another embodiment in which the intrinsic conductive layer 118 formed on the structured wafer backside 102 during EDM processing is used as a seed layer for electroplating a metal layer 600 on the structured backside 102 of the semiconductor wafer 100. The embodiment shown in FIG. 8A is similar to the embodiment shown in FIG. 7. Different, however, the metal layer 600 is thinned after deposition, e.g. by grinding, so as to fill in the structures formed in the wafer backside 102 but so as to not extend onto the exposed surface 502 of the structures. Remaining regions of the assisting electrode 112 formed at the wafer backside 102 are removed as part of the metal layer thinning process. The functional chip sites 106, dicing streets 108 and active device regions 110 at the frontside 104 of the semiconductor wafer 100 are not shown in FIG. 8A for ease of illustration.

Figure 8B:
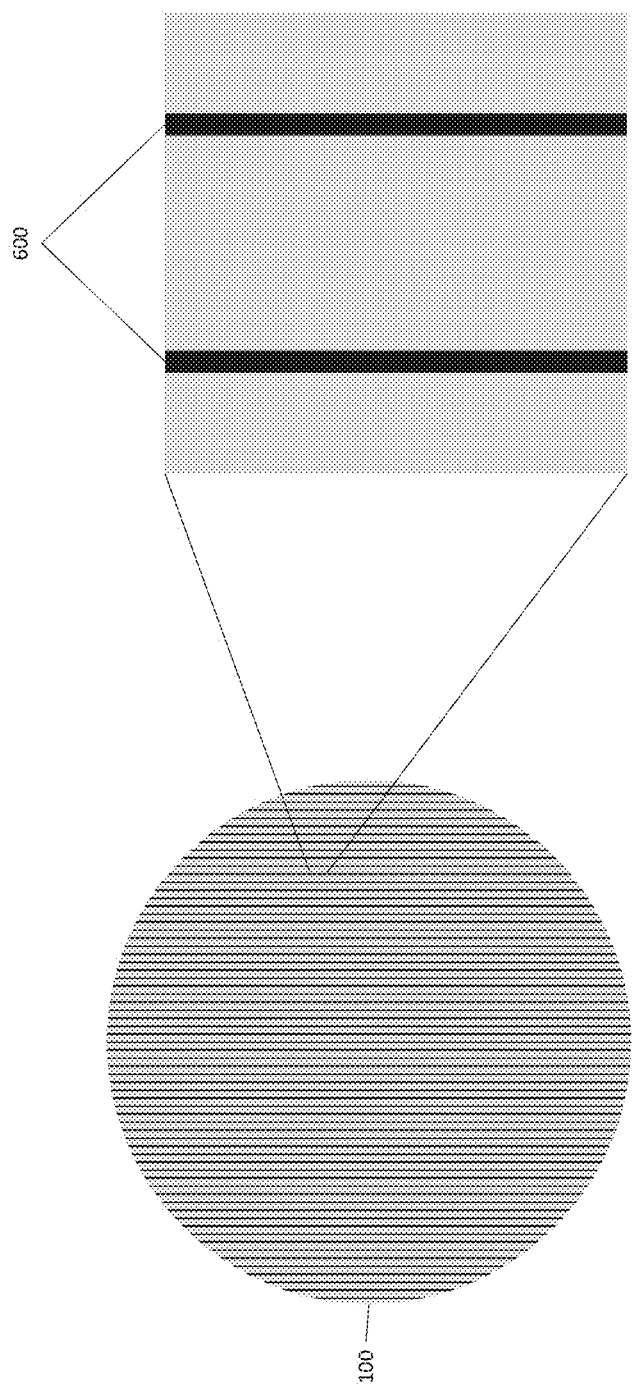
FIGS. 8B through 8D illustrate respective bottom plan views of different embodiments of the structured surface of the semiconductor wafer of FIG. 8A.
Figure 8C:
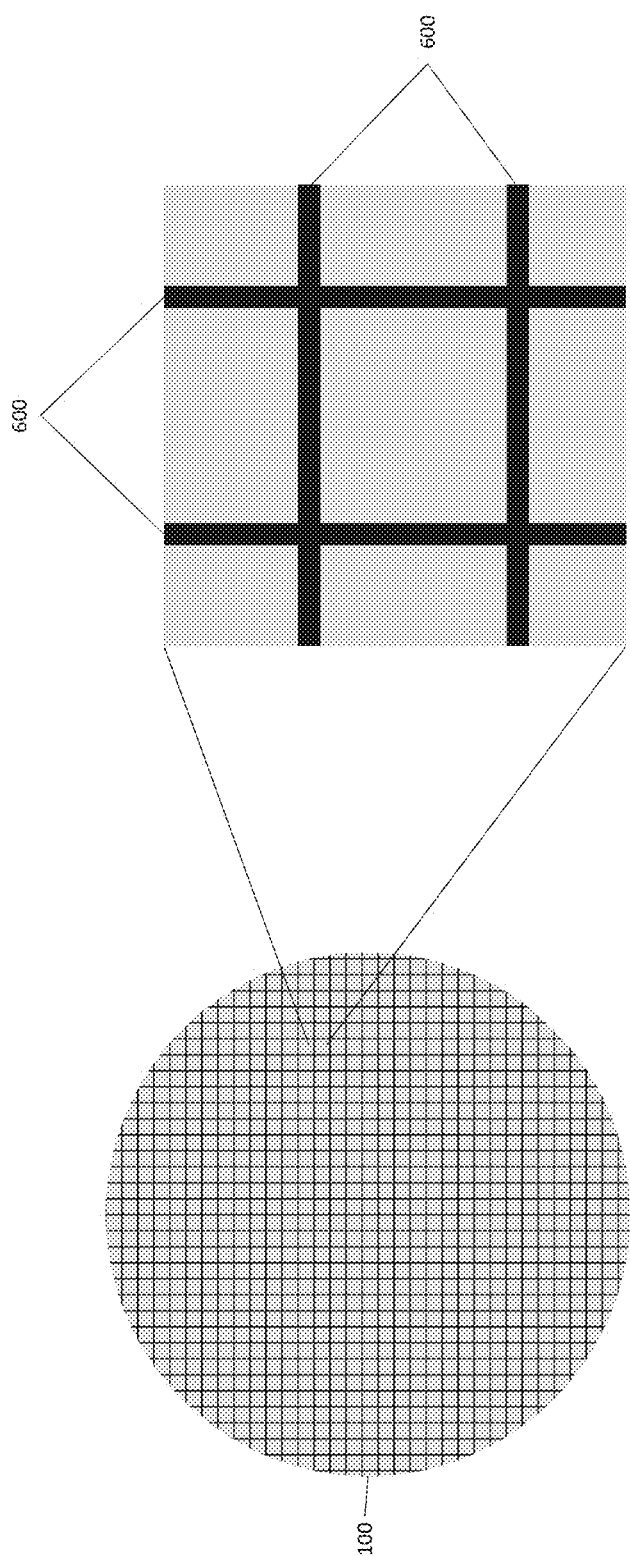
Figure 8D:
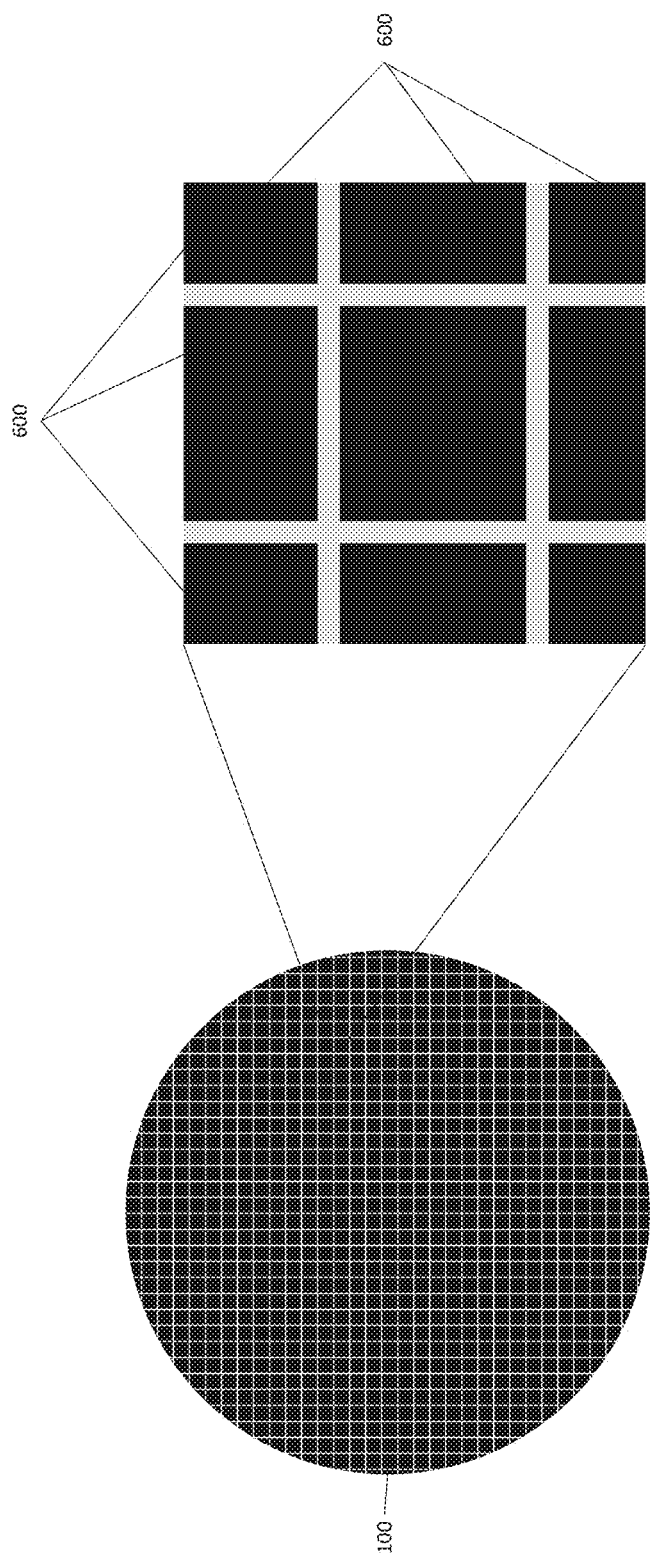

The structures formed in the backside 102 of the semiconductor wafer 100 can have any shape. For example, the structures may be in the form of stripes e.g. as shown in FIG. 8B, a cross-hatched structure e.g. as shown in FIG. 80, a mesh structure e.g. as shown in FIG. 8D, etc. The structures do not need to be patterned into all of the functional chip sites 106 included in the semiconductor wafer 100 and/or the structures can differ from chip site-to-chip site or from one group of functional chip sites 106 to another group. Accordingly, not every functional chip site 106 included in the semiconductor wafer 100 need be structured the same way at the wafer backside 102. That is, at least some of the functional chip sites 106 may be structured differently at the backside 102 of the semiconductor wafer 100.

Figure 9:
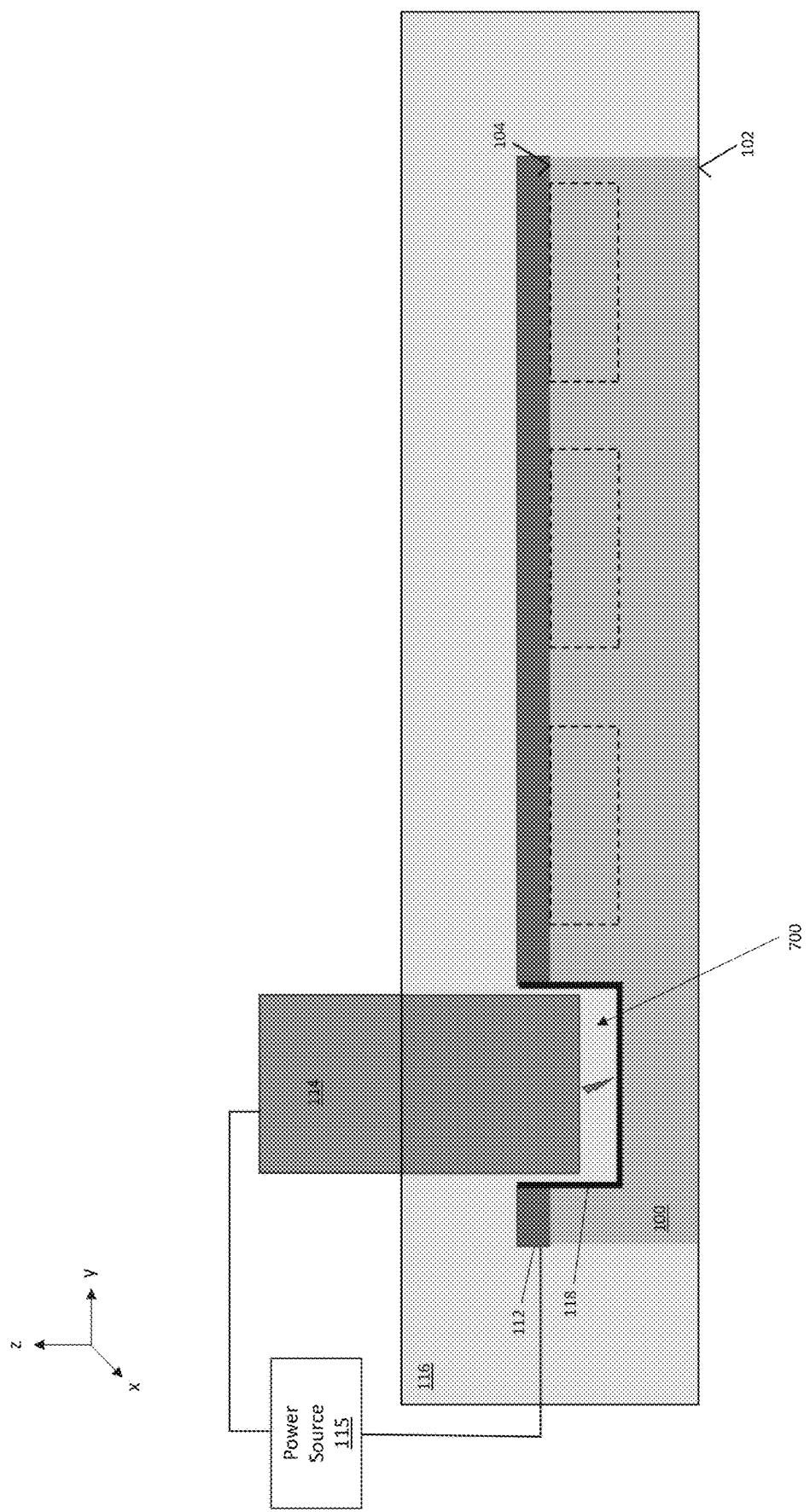
FIG. 9 illustrate a partial sectional view of an embodiment of structuring the frontside of a semiconductor wafer having a plurality of functional chip sites, by EDM.

FIG. 9 illustrates an embodiment of structuring the frontside 104 of a semiconductor wafer 100 having a plurality of functional chip sites 106, by electrical discharge machining (EDM). One or more semiconductor devices are formed in a device region 110 of each functional chip site 106 at the frontside 104 of the semiconductor wafer 100, as previously described herein. The functional chip sites 106, dicing streets 108 and active device regions 110 at the frontside 104 of the semiconductor wafer 100 are not shown in FIG. 9 for ease of illustration. The semiconductor devices may be completed after the EDM process, including frontside metallization.

The assisting electrode 112 is formed at the frontside 104 of the semiconductor wafer 100 according to this embodiment. In the case of frontside structing, it may be desirable to limit the tool electrode material to avoid metal contamination of the semiconductor wafer 100. For example, the tool electrode 114 may be made of graphite instead of Cu for frontside structuring. Sections 700 of the semiconductor wafer 100 are removed at the wafer frontside 104 by EDM or µEDM processing, by moving the tool electrode 114 and/or the semiconductor wafer 100 in the vertical direction (z) and in the horizontal direction (y) to remove material from the wafer frontside 104. In addition or alternatively, the plasma may be maintained by increasing the applied voltage. FIG. 9 shows one region of the wafer frontside 104 being structured, with the other frontside regions to be structured illustrated as dashed boxes.

Figure 10:
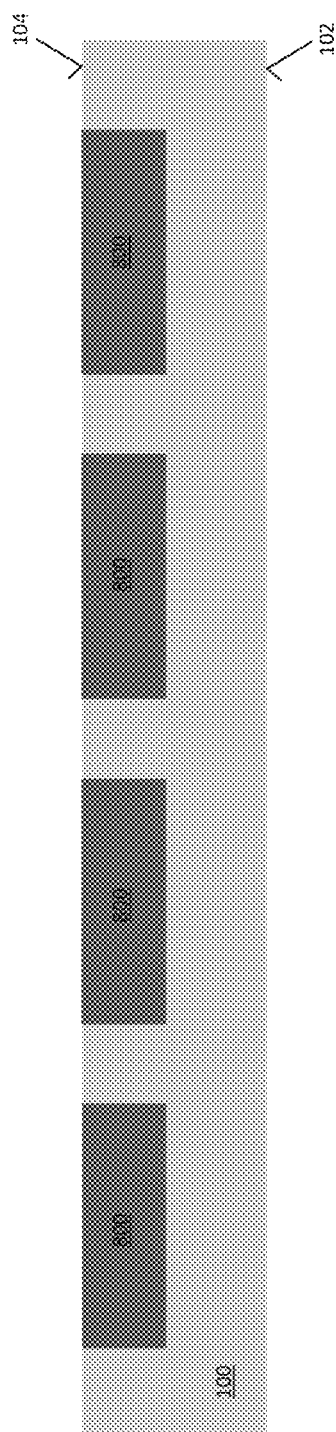
FIG. 10 illustrate a partial sectional view of the semiconductor wafer of FIG. 9, after the structured regions are filled with a doped epitaxial semiconductor material.

FIG. 10 shows the semiconductor wafer 100 after the frontside structuring is complete, and after a doped semiconductor region 800 is epitaxially grown in each section 700 of the semiconductor wafer 100 previously removed at the wafer frontside 104 by EDM processing. Any standard epitaxial growth/doping process may be used to form the doped semiconductor regions 800. For example, after the EDM structuring is complete, a hard mask (e.g. silicon nitride, graphite, etc.) may be deposited and structured to form a protected region where there is to be no epitaxial growth. After the epitaxy process, the hard mask is removed and standard processing can follow. Prior to epi deposition, any standard surface treatment (e.g. $H_2$ treatment) may be performed to precondition the structured wafer surface 104.

With this approach, epitaxy with a desired doping level is deposited only on selected regions of the semiconductor wafer 100.

As mentioned above, the thinning and structuring embodiments described herein can use EDM or µEDM pulses. A standard solid EDM electrode rod may be used, or the tool electrode shown in FIG. 4 may be used to dispense a dielectric liquid through a channel in the tool electrode and over the semiconductor wafer as part of the EDM process. Also, the tool electrode and/or the semiconductor wafer may be rotated as part of the EDM process. The semiconductor wafer may be singulated to separate the functional chip sites included in the wafer into individual physical dies, after structuring and/or thinning the semiconductor wafer via EDM. An integral support ring may be formed at the wafer backside, to enhance the mechanical stability of relatively thin wafers (e.g. 40 to 100 µm or less, e.g. 10 to 20 µm).

As explained previously herein, the semiconductor wafer to be thinned by the EDM process may be doped or undoped. In the case of a doped wafer, the conductivity of the semiconductor wafer may be high enough so that the assisting electrode and intrinsic conductive layer are not used. For example, in some embodiments, the semiconductor wafer to be thinned by the EDM process may have a conductivity greater than 0.01 Siemens/cm (or a resistivity of less than 100 Ωcm). Such a doped semiconductor wafer may form one of the electrodes needed to enable the EDM process.

Figure 11B:
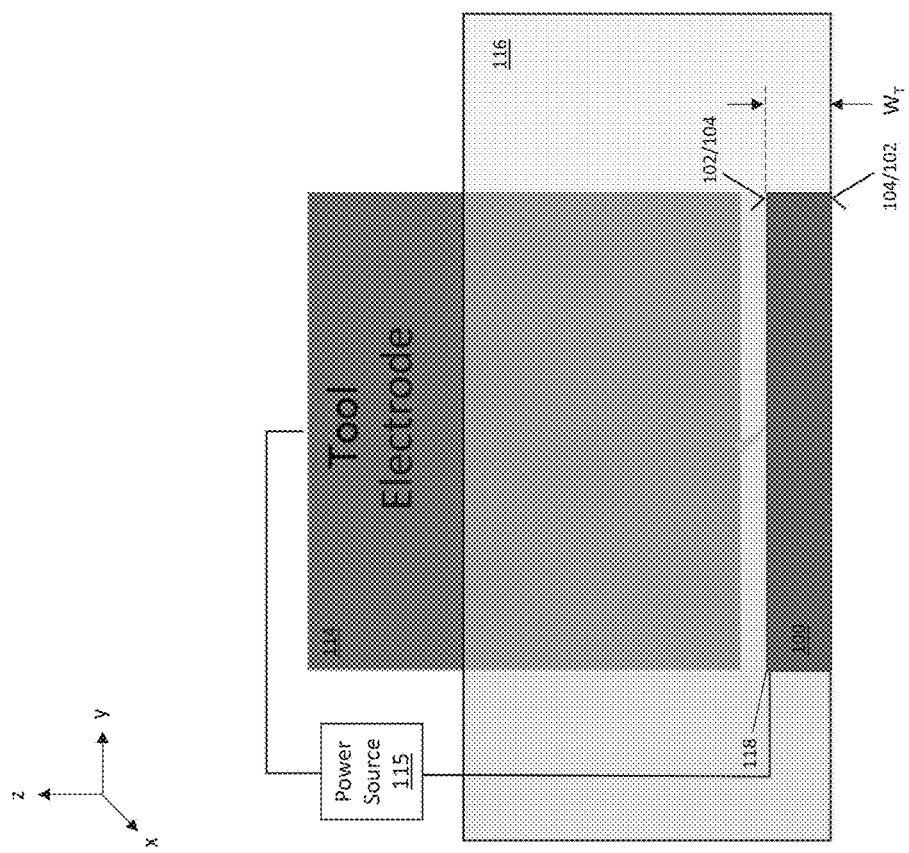
FIGS. 11A and 11B illustrate partial sectional views of an embodiment of thinning a doped semiconductor wafer, by electrical discharge machining (EDM).
Figure 11A:
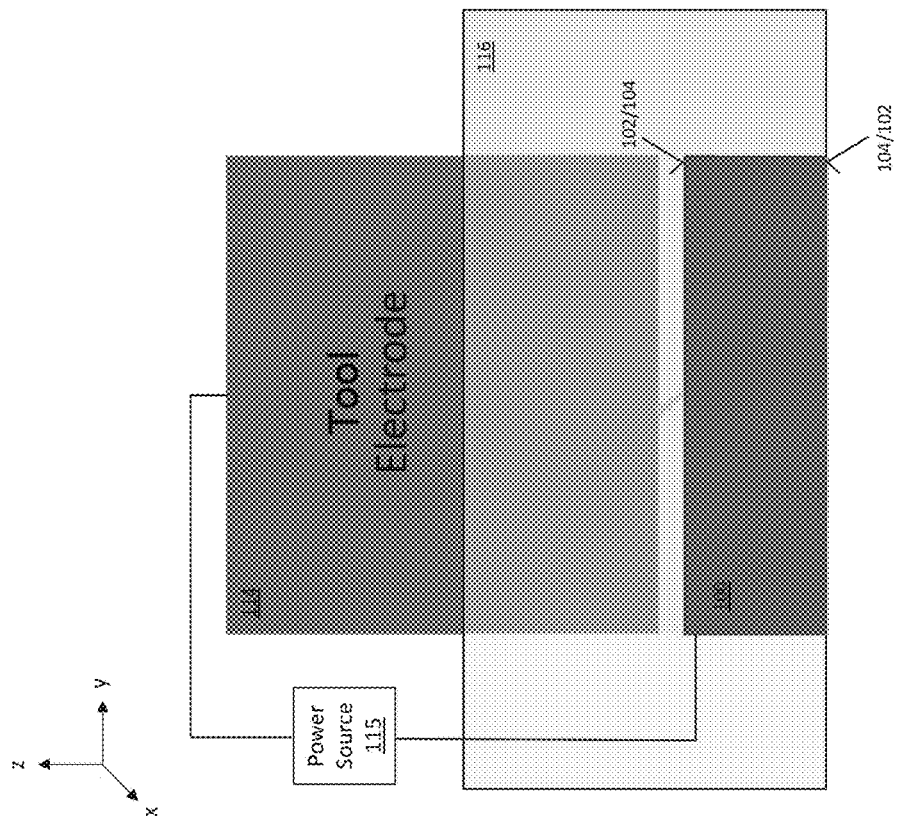

FIGS. 11A and 11B illustrate an embodiment of thinning the backside 102 or the frontside 104 of the semiconductor wafer 100, by electrical discharge machining (EDM). According to this embodiment, the semiconductor wafer 100 is doped to have a conductivity that is high enough so that the assisting electrode is not used. For example, in some embodiments, the semiconductor wafer 100 is doped to have a conductivity greater than 0.01 Siemens(S)/cm (or a resistivity of less than 100 Ωcm).

According to the embodiment illustrated in FIGS. 11A and 11B the doped semiconductor wafer 100 forms one of the electrodes needed to enable the EDM process. The other electrode 114 is positioned over the side 102/104 of the doped wafer 100 to be thinned by the EDM process (the front and/or back side of the wafer may be thinned by the EDM process). An oil-based dielectric 116 may be used since the assisting electrode (AE) 112 is omitted in this embodiment. A power source 115 applies voltage pulses between the electrode formed by the doped semiconductor wafer 100 and the tool electrode 114 positioned over the side 102/104 of the doped wafer 100 to be thinned, as part of the EDM process. No direct physical contact occurs between the tool electrode 114 and the doped semiconductor wafer 100. Hence, the EDM process may be used to machine/remove semiconductor material much harder than the tool electrode 114, e.g. such as SC.

Since the semiconductor wafer 100 is doped high enough in this embodiment to form one of the electrodes for the EDM process, the wafer 100 continues to provide the required electrical conductivity during the EDM process, allowing for continued thinning of the wafer 100 with each successive spark (shown as a spark/bolt in FIGS. 11A and 11B) caused by voltage pulses applied by the power source 115 between the tool electrode 114 and the doped wafer 100. Depending on the type of dielectric liquid 116 used, the intrinsic conductive layer 118 may still form on the side of the doped semiconductor wafer 100 being thinned. For example, in the case of an oil-based dielectric liquid 116, the plasma produced during sparking may crack the dielectric liquid 116, forming a pyrostatic carbon. The pyrostatic carbon may deposit on the side 102/104 of the doped semiconductor wafer 100 being thinned, and form the intrinsic conductive layer 118. The intrinsic conductive layer 118 is not shown in FIGS. 11A and 11B for ease of illustration, and may not be present during the EDM process e.g. in the case of a water-based dielectric liquid 116. The EDM process continues until the target wafer thickness $W_T$ (e.g. 40 to 100 µm or less, e.g. 10 to 20 µm) is achieved as shown in FIG. 11B.

Prior to or after the EDM thinning process, a plurality of functional chip sites may be formed at the frontside 104 of the semiconductor wafer 100. Each functional chip site is a separate or dedicated region of the semiconductor wafer 100 in which one or more passive and/or active devices are formed. The functional chip sites may be separated from one another by dicing streets which indicate where the functional chip sites are to be separated (singulated) into individual physical dies (chips), as previously described herein.

The EDM embodiments illustrated in FIGS. 2 through 3E and FIGS. 5A through 9 likewise may omit the assisting electrode (AE) 112 if the semiconductor wafer 100 being thinned is doped to have a conductivity sufficient to form one of the electrodes for the EDM process, e.g. a conductivity greater than 0.01 Siemens(S)/cm (or a resistivity of less than 100 Ωcm). Hence, the EDM embodiments illustrated in FIGS. 2 through 3E and FIGS. 5A through 9 may be readily modified by omitting the assisting electrode (AE) 112 and instead using the semiconductor wafer 100 as the second electrode for maintaining a plasma between the tool electrode 114 and the side of the wafer 100 being thinned throughout the EDM process. Depending on the type of dielectric liquid 116 used (e.g. oil-based or water-based), the intrinsic conductive layer 118 may or may not form on the side of the doped semiconductor wafer 100 being thinned, as explained above.

Figure 12B:
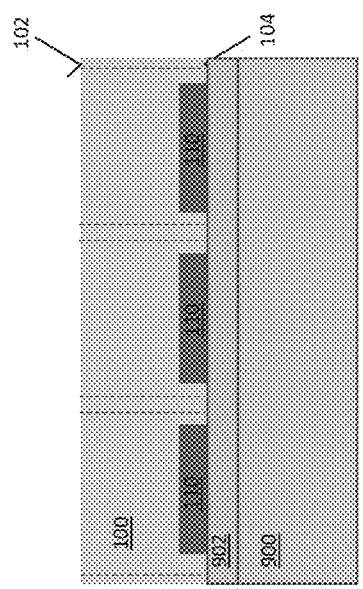
FIGS. 12A and 12B illustrate partial sectional views of an embodiment of protecting the device side of a semiconductor wafer before thinning the opposite side of the wafer by electrical discharge machining (EDM).
Figure 12A:
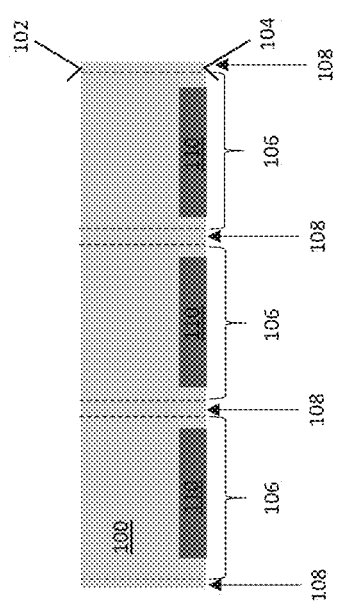

FIGS. 12A and 12B illustrate an embodiment of protecting the frontside 104 of the semiconductor wafer 100 prior to electrical discharge machining (EDM). According to this embodiment, a plurality of functional chip sites 106 have been formed at the frontside 104 of the semiconductor wafer 100 prior to the EDM process as shown in FIG. 12A. Each functional chip site 106 is a separate or dedicated region of the semiconductor wafer 100 in which one or more passive and/or active devices are formed. The functional chip sites 106 may be separated from one another by dicing streets 108 the boundaries of which are graphically illustrated in FIGS. 12A and 12B as dashed lines, and indicate where the semiconductor wafer 100 is to be singulated, e.g. by mechanical sawing, laser cutting, etc., to separate the functional chip sites 106 into individual physical dies (chips). Each functional chip site 106 has one or more semiconductor devices formed in a device region 110 of the functional chip site 106 at the frontside 104 of the semiconductor wafer 100. Any type of semiconductor device may be formed at the frontside 104 of the semiconductor wafer 100 using standard device fabrication processes, as previously described herein.

FIG. 12B shows the semiconductor wafer 100 with a protective structure 900/902 applied to the frontside 104 of the wafer 100. The protective structure 900/902 may include one or more layers, films, substrates, etc., and protects the frontside 104 of the wafer 100 during the EDM process. In one embodiment, the protective structure 900/902 includes a substrate 900 such as a glass carrier attached to the frontside 104 of the semiconductor wafer 100 by an adhesive 902. In another embodiment, the protective structure 900/902 may be a stabilizing foil rolled onto the frontside 104 of the semiconductor wafer 100. Still other types of protective structures may be used. In each case, the backside 102 of the semiconductor wafer 100 may be thinned using any of the EDM processes described with the protective structure 900/902 protecting the frontside 104.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of thinning a semiconductor wafer having a plurality of functional chip sites, the method comprising:
    forming one or more semiconductor devices in a device region of each functional chip site at a frontside of the semiconductor wafer;
    forming an electrode at a backside of the semiconductor wafer opposite the frontside, the electrode having a greater electrical conductivity than the backside of the semiconductor wafer; and
    thinning the semiconductor wafer by applying voltage pulses between the electrode at the backside of the semiconductor wafer and a tool electrode positioned over the backside as part of an electrical discharge machining (EDM) process before the electrode is removed by the EDM process, and between the tool electrode and an intrinsic conductive layer formed on the backside of the semiconductor wafer after the electrode is removed by the EDM process.

2. The method of claim 1, wherein the EDM process comprises:
    covering the backside of the semiconductor wafer with a dielectric liquid; and
    moving the tool electrode and/or the semiconductor wafer in the dielectric liquid in a vertical direction to maintain a plasma between the tool electrode and the electrode at the backside of the semiconductor wafer before the electrode is removed by the EDM process, and between the tool electrode and the intrinsic conductive layer after the electrode is removed by the EDM process.

3. The method of claim 2, wherein the tool electrode has a diameter less than the diameter of the semiconductor wafer so that an annular ring of semiconductor material remains around the periphery of the semiconductor wafer after the EDM process is terminated.

4. The method of claim 1, wherein the tool electrode has a diameter less than the diameter of the semiconductor wafer, and wherein the EDM process comprises:
    covering the backside of the semiconductor wafer with a dielectric liquid; and
    moving the tool electrode and/or the semiconductor wafer in the dielectric liquid in a horizontal direction along the backside of the semiconductor wafer and in a vertical direction to maintain a plasma between the tool electrode and the electrode at the backside of the semiconductor wafer before the electrode is removed by the EDM process, and between the tool electrode and the intrinsic conductive layer after the electrode is removed by the EDM process.

5. The method of claim 4, further comprising:
    limiting the movement of the tool electrode in the horizontal direction to less than the diameter of the semiconductor wafer, so that an annular ring of semiconductor material remains around the periphery of the semiconductor wafer after the EDM process is terminated.

6. The method of claim 1, wherein the voltage pulses have a pulse energy per pulse of at most 1 mili joules during the EDM process.

7. The method of claim 1, wherein the voltage pulses have a pulse energy per pulse greater than 1 mili joules during a first part of the EDM process and a pulse energy per pulse of at most 1 mill joules during a second part of the EDM process after the first part.

8. The method of claim 1, wherein thinning the semiconductor wafer further comprises grinding the backside with a grinding wheel before beginning the EDM process, so that the backside of the semiconductor wafer is partly thinned by the grinding and partly thinned by the EDM process.

9. The method of claim 1, further comprising:
    dispensing a dielectric liquid through a channel in the tool electrode and over the backside of the semiconductor wafer as part of the EDM process.

10. The method of claim 1, further comprising:
    rotating the tool electrode and/or the semiconductor wafer as part of the EDM process.

11. The method of claim 1, wherein the semiconductor wafer is doped to have a conductivity greater than 0.01 Siemens/cm or a resistivity of less than 100 Ωcm.

12. The method of claim 1, further comprising:
    applying a protective structure over the frontside of the semiconductor wafer prior to thinning the semiconductor wafer.

13. A method of structuring a semiconductor wafer having a plurality of functional chip sites, the method comprising:
    forming one or more semiconductor devices in a device region of each functional chip site at a frontside of the semiconductor wafer;
    forming an electrode at one of the frontside or a backside of the semiconductor wafer; and
    structuring the side of the semiconductor wafer at which the electrode is formed by applying voltage pulses between the electrode and a tool electrode positioned above the semiconductor wafer as part of an electrical discharge machining (EDM) process before the electrode is removed by the EDM process, and between the tool electrode and an intrinsic conductive layer formed on the side of the semiconductor wafer being structured after the electrode is removed by the EDM process.

14. The method of claim 13, wherein the tool electrode is structured with a pattern to be imparted on the semiconductor wafer, and wherein the EDM process comprises:
    covering the side of the semiconductor wafer at which the electrode is formed with a dielectric liquid; and
    moving the tool electrode and/or the semiconductor wafer in the dielectric liquid in a vertical direction to maintain a plasma between the tool electrode and the electrode formed at the frontside or the backside of the semiconductor wafer before the electrode is removed by the EDM process, and between the tool electrode and the intrinsic conductive layer after the electrode is removed by the EDM process.

15. The method of claim 13, wherein the tool electrode has a diameter less than the diameter of the semiconductor wafer, and wherein the EDM process comprises:
covering the side of the semiconductor wafer at which the electrode is formed with a dielectric liquid; and
moving the tool electrode and/or the semiconductor wafer in the dielectric liquid in a horizontal direction along the semiconductor wafer and in a vertical direction to maintain a plasma between the tool electrode and the electrode formed at the frontside or the backside of the semiconductor wafer before the electrode is removed by the EDM process, and between the tool electrode and the intrinsic conductive layer after the electrode is removed by the EDM process.

16. The method of claim 13, wherein the electrode is formed at the backside of the semiconductor wafer, and wherein the backside of the semiconductor wafer is structured by the EDM process, the method further comprising:
forming a metal layer on the structured backside of the semiconductor wafer.

17. The method of claim 16, wherein the intrinsic conductive layer is used as a seed layer for electroplating the metal layer on the structured backside of the semiconductor wafer.

18. The method of claim 13, wherein the electrode is formed at the backside of the semiconductor wafer, wherein the backside of the semiconductor wafer is structured by the EDM process, and wherein at least some of the functional chip site are structured differently at the backside of the semiconductor wafer.

19. The method of claim 13, wherein the electrode is formed at the backside of the semiconductor wafer, wherein the backside of the semiconductor wafer is structured by the EDM process, and wherein the backside of the semiconductor wafer is structured with a mesh pattern and/or a stripe pattern by the EDM process.

20. The method of claim 13, wherein the electrode is formed at the frontside of the semiconductor wafer, and wherein sections of the semiconductor wafer are removed at the frontside by the EDM process.

21. The method of claim 20, further comprising:
epitaxially growing a doped semiconductor region in each section of the semiconductor wafer removed at the frontside by the EDM process.

22. The method of claim 13, further comprising:
dispensing a dielectric liquid through a channel in the tool electrode and over the semiconductor wafer as part of the EDM process.

23. The method of claim 13, further comprising:
rotating the tool electrode and/or the semiconductor wafer as part of the EDM process.

24. The method of claim 13, wherein the semiconductor wafer is doped to have a conductivity greater than 0.01 Siemens/cm or a resistivity of less than 100 Ωcm.

25. The method of claim 13, further comprising:
applying a protective structure over the frontside of the semiconductor wafer prior to thinning the semiconductor wafer.

26. A method, comprising:
positioning a tool electrode over a front or back side of a doped semiconductor wafer; and
thinning the doped semiconductor wafer by applying voltage pulses between the tool electrode and the doped semiconductor wafer as part of an electrical discharge machining (EDM) process, wherein the doped semiconductor wafer functions as a second electrode to enable the EDM process.

27. The method of claim 26, wherein the doped semiconductor wafer has a conductivity greater than 0.01 Siemens/cm or a resistivity of less than 100 Ωcm.

* * * * *